US012656414B2

(12) United States Patent
Dixit et al.

(10) Patent No.: US 12,656,414 B2
(45) Date of Patent: Jun. 16, 2026

(54) INTELLIGENT FUSE SYSTEM

(71) Applicant: Eaton Intelligent Power Limited, Dublin (IE)

(72) Inventors: Rishabh Dixit, Pune (IN); Michael C. Henricks, Ballwin, MI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 191 days.

(21) Appl. No.: 18/610,129

(22) Filed: Mar. 19, 2024

(65) Prior Publication Data

US 2025/0298094 A1     Sep. 25, 2025

(51) Int. Cl.
G01R 31/74          (2020.01)
(52) U.S. Cl.
CPC .................................... G01R 31/74 (2020.01)
(58) Field of Classification Search
None
See application file for complete search history.

(56) References Cited

U.S. PATENT DOCUMENTS 10,553,386 B2 * 2/2020 von Zur Muehlen . H01H 85/38
11,551,900 B2 * 1/2023 Darr ........................ H01H 21/16

| | | | |
|---|---|---|---|
| 11,867,719 B1 * | 1/2024 | Schmitt .............. | H01H 85/2045 |
| 11,892,522 B2 * | 2/2024 | Surve ..................... | H02H 3/046 |
| 12,517,783 B2 * | 1/2026 | Chen ................... | G06F 11/1004 |
| 2015/0137934 A1 * | 5/2015 | von Zur Muehlen . | H01H 85/43 |
| | | | 337/273 |
| 2015/0348645 A1 * | 12/2015 | Kasorla ................. | G11C 17/16 |
| | | | 365/96 |
| 2018/0107171 A1 * | 4/2018 | Kang ................. | G05B 23/0205 |
| 2023/0160977 A1 * | 5/2023 | Surve ..................... | H02H 3/046 |
| | | | 324/550 |
| 2023/0408602 A1 * | 12/2023 | Schmitt .............. | H01H 85/0241 |

* cited by examiner

*Primary Examiner* — Jermele M Hollington
(74) *Attorney, Agent, or Firm* — Eckert Seamans Cherin & Mellott, LLC

(57) ABSTRACT

In one embodiment, a system for determining appropriate ratings of one or more fuses within a fuse housing is provided. The system includes at least one sensor configured to measure operational data associated with the one or more fuses, and a controller coupled to the at least one sensor. The controller is configured to perform operations including receiving the operational data from the at least one sensor, comparing the operational data with predetermined values associated with the one or more fuses, and generating a fuse message based on the comparison. The fuse message includes information indicating whether the one or more fuses are associated with appropriate ratings.

18 Claims, 7 Drawing Sheets

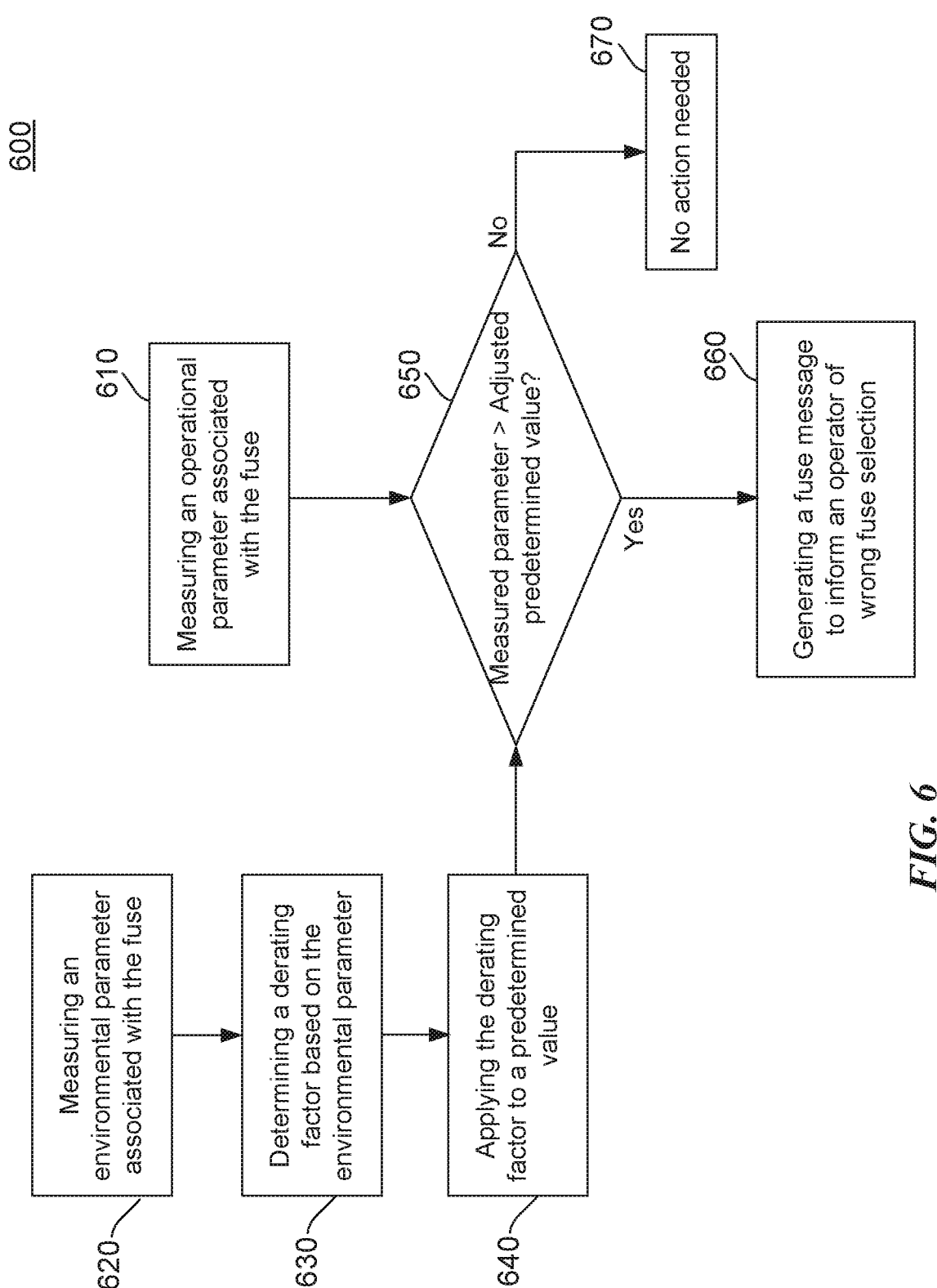

600

610 — Measuring an operational parameter associated with the fuse

620 — Measuring an environmental parameter associated with the fuse

630 — Determining a derating factor based on the environmental parameter

640 — Applying the derating factor to a predetermined value

650 — Measured parameter > Adjusted predetermined value?

No

670 — No action needed

Yes

660 — Generating a fuse message to inform an operator of wrong fuse selection

*FIG. 6*

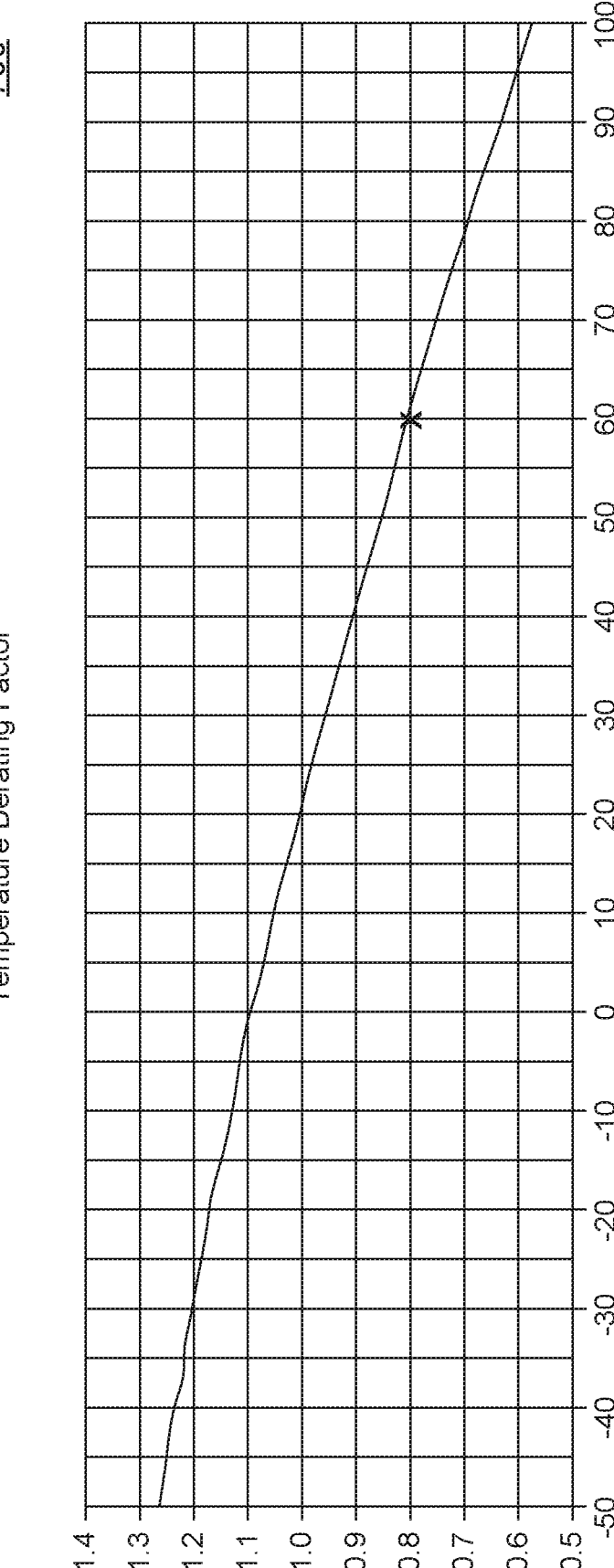
*FIG. 7*

INTELLIGENT FUSE SYSTEM

TECHNICAL FIELD

This disclosure generally relates to a fuse, and more particularly to an intelligent fuse system.

BACKGROUND

Fuses are widely used as overcurrent protection devices to protect electrical components and circuits in electrical power systems from potentially damaging overcurrent conditions. For example, fuses may include fuse elements that are configured to be heated and melted by high current in order to interrupt the current flowing through the fuses. To meet different circuit protection requirements and provide optimal fuse performance, fuses with suitable fuse ratings such as current rating must be properly selected based on the specific application. Selecting a fuse with inappropriate fuse rating could lead to various problems such as fuse burning out during overload conditions, nuisance opening of fuse (e.g., a fuse interrupting an overcurrent without opening), etc. Improvements are accordingly desired.

SUMMARY OF PARTICULAR EMBODIMENTS

This disclosure presents an intelligent fuse system that is capable of providing automatic alerts for wrong fuse selection. Specifically, the system is configured to monitor, in real-time, fuse performance in a particular fuse application and determine whether the fuse in use has been properly selected for the application. In particular, the system according to this disclosure may utilize sensors to detect various parameters associated with fuse operation and compare the sensor data with a predetermined value. For example, the predetermined value may be a preset fuse rating built into the firmware of the fuse such as rated current, rated voltage, etc. Based on the comparison, the system may generate an automatic alert in case of wrong fuse selection. The disclosed system may also be used to provide the correct fuse rating, which may help an operator to identify the correct replacement fuse quickly and efficiently before the working fuse fails.

In one embodiment, a system for determining appropriate ratings of one or more fuses within a fuse housing is provided. The system includes at least one sensor configured to measure operational data associated with the one or more fuses, and a controller coupled to the at least one sensor. The controller is configured to perform operations including receiving the operational data from the at least one sensor, comparing the operational data with predetermined values associated with the one or more fuses, and generating a fuse message based on the comparison. In particular, the fuse message includes information whether the one or more fuses are associated with appropriate ratings.

In particular embodiments, the operational data includes data associated with current, voltage, or resistance of the one or more fuses. In particular embodiments, the operations further include adjusting the predetermined values based on a tolerance factor, and comparing the operational data with the adjusted predetermined values associated with the one or more fuses. In particular embodiments, the operations further include adjusting the predetermined values based on a derating factor, and comparing the operational data with the adjusted predetermined values associated with the one or more fuses. In particular embodiments, the derating factor is determined based on environmental data corresponding to an environment in which the one or more fuses are located. In particular embodiments, the environmental data includes data associated with ambient temperature, altitude, or humidity of the environment. In particular embodiments, the fuse message includes an alert indicating that the one or more fuses are not associated with appropriate ratings. In particular embodiments, the fuse message includes a recommendation for an alternative fuse. In particular embodiments, the system further includes a display configured on the fuse housing to display the fuse message. In particular embodiments, the operations further include transmitting the fuse message to a computing device having a user interface configured to display the fuse message.

In one embodiment, a method for determining appropriate ratings of one or more fuses within a fuse housing is provided. The method includes measuring, by at least one sensor, operational data associated with the one or more fuses, comparing the operation data with predetermined values associated with the one or more fuses, and generating a fuse message based on the comparison. In particular, the fuse message includes information indicating whether the one or more fuses are associated with appropriate ratings.

In particular embodiments, the operational data includes data associated with current, voltage, or resistance of the one or more fuses. In particular embodiments, the method further includes adjusting the predetermined values based on a tolerance factor, and comparing the operational data with the adjusted predetermined values associated with the one or more fuses. In particular embodiments, the method further includes adjusting the predetermined values based on a derating factor, and comparing the operational data with the adjusted predetermined values associated with the one or more fuses. In particular embodiments, the derating factor is determined based on environmental data corresponding to an environment in which the one or more fuses are located. In particular embodiments, the environmental data includes data associated with ambient temperature, altitude, or humidity of the environment. In particular embodiments, the fuse message includes an alert indicating that the one or more fuses are not associated with appropriate ratings. In particular embodiments, the fuse message includes a recommendation for an alternative fuse. In particular embodiments, the method further includes sending instructions to display the fuse message on a display configured on the fuse housing. In particular embodiments, the method further includes transmitting the fuse message to a computing device having a user interface configured to display the fuse message.

BRIEF DESCRIPTION OF THE DRAWINGS

Embodiments in accordance with this disclosure will now be described by reference to the accompanying drawings.

FIG. 6 illustrates a flow diagram of another example method for determining whether a correct fuse is used.

FIG. 7 illustrates an example temperature derating diagram.

DESCRIPTION OF EXAMPLE EMBODIMENTS

Fuses are typically used to provide overcurrent protection in an electrical circuitry. For example, during operation when the current in the circuitry exceeds the rated capacity of the fuse, a fuse element of the fuse is configured to heat and eventually melt, breaking the circuitry and stopping the flow of electricity. The breaking of the circuitry from the melting of the fuse element mitigates damage to the electrical system by preventing high current from reaching sensitive circuit components. Selecting the fuse with the correct rating for use is thus important, for example, to ensure that the fuse continuously carries load when the current in the circuit is below the fuse's rated capacity and breaks the electrical connection when the current exceeds the fuse's rated capacity. However, in practice, completely avoiding the selection of the wrong fuse amperage for various applications is not realistic due to human error. This may lead to various problems like fuse burning out during overload conditions, nuisance opening of the fuse, premature aging of the fuse, and so on. The appropriate fuse rating for any particular application is not a fixed value because the appropriate fuse rating varies depending on various factors including the characteristics of the external environment (e.g., temperature). For example, in certain applications such as automotive application, operational conditions in which the fuse operates may differ significantly, causing the actual fuse capacity to deviate significantly. As such, the fuse's rating may need to be reassessed for each specific application and at operating conditions to ensure that the selected fuse does not run beyond its capacity. The terms fuse rating and fuse capacity are used herein interchangeably and represent the value of the current that a fuse can carry continuously without deterioration under specified conditions.

As a solution, the embodiments disclosed herein present an intelligent fuse system configured to automatically detect whether a fuse with the correct (or wrong) rating is selected for an application and provide an alert in case of wrong fuse selection. Specifically, the system may measure one or more parameters related to fuse performance and compare the measured parameter with a predetermined value such as fuse rating to determine whether the fuse has been correctly selected for the specific application. The system may also evaluate the fuse rating based on real-time operating conditions to determine the actual fuse capacity. In case of wrong fuse selection (e.g., a fuse with wrong rating is selected), the system may automatically generate an alert to inform an operator that the working fuse is not appropriately rated, so as to alert the operator to quickly identify and remove the wrong fuse before failure happens. The system may also provide a recommendation that suggests an alternative fuse rating that is more appropriately suitable for the application.

Figure 1:
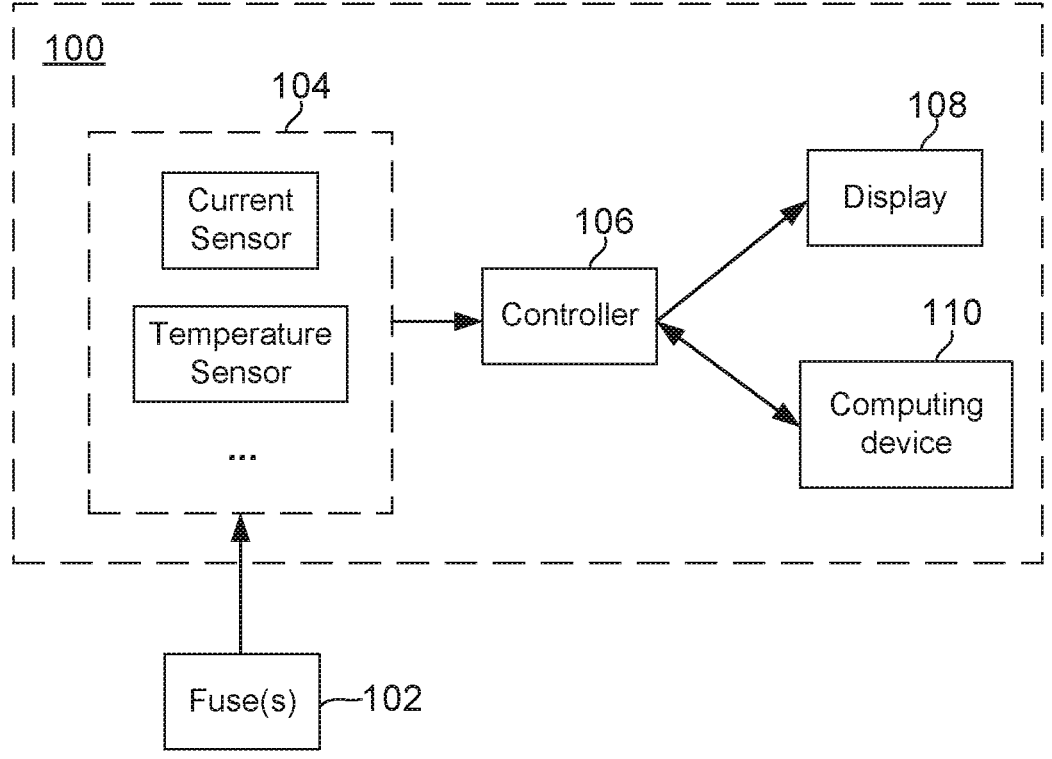
FIG. 1 illustrates a schematic diagram of an embodiment of an intelligent fuse system.

FIG. 1 illustrates a schematic diagram of an embodiment of a system 100 that is configured to evaluate the appropriate rating of one or more fuses 102. In particular embodiments, the system 100 may be configured to automatically determine whether the fuse in operation is appropriately rated for the intended application and provide a notification, or an alert, if the fuse in operation is not appropriately rated. The system 100 may also be configured to automatically provide a fuse recommendation indicating a fuse that is appropriate for the application, for example, based on various data that is inputted into the system 100 (e.g., temperature). By providing proactive alerts to the user, embodiments disclosed herein may help the user determine if a fuse in operation is not appropriately rated so that the user may replace the fuse before failure. This may also help prevent premature aging of the fuse, avoid system downtime caused by fuse failure, and ensure operational safety for human personnel.

In particular embodiments, the system 100 may include one or more sensors 104 and a controller 106 coupled to one or more of the sensors 104. The sensors 104 may be configured to collect or receive one or more parameters associated with the fuse 102, e.g., in real-time. Such parameters may be referred herein as sensor data. As an example and not by way of limitation, the sensor parameters may include parameters associated with the operation of the fuse 102 such as current, voltage, resistance, fuse temperature, electrical loading, or other suitable parameters related to fuse performance ("operational parameters"). As another example, the sensor parameters may include parameters corresponding to an environment in which the fuse 102 is located such as ambient temperature, altitude, humidity, pressure, etc. ("environmental parameters"). Example sensors 104 that are configured to collect operational parameters include a current sensor configured to measure electrical current through the fuse 102, a voltage sensor configured to measure voltage across the fuse 102, a resistance sensor configured to measure resistance of the fuse 102, a temperature sensor configured to measure operating temperature of the fuse 102, or other suitable sensors for measuring fuse performance parameters. Example sensors 104 that are configured to collect environmental parameters include a temperature sensor configured to measure ambient temperature to which the fuse 102 is exposed, an altitude sensor configured to measure altitude of the location of the fuse 102, a humidity sensor configured to measure ambient humidity, a pressure sensor configured to measure ambient pressure, or other suitable sensors for measuring conditions of the environment in which the fuse 102 is located. The system 100 may be configured to take as input one or more of the operational parameters and environmental parameters to determine the appropriate fuse rating. In certain embodiments, the sensor 104 may be coupled to the fuse 102 or located proximately to the fuse 102. In other embodiments, the sensor 104 may be positioned within, on, or in proximity to a fuse housing that houses the fuse 102.

In particular embodiments, the one or more parameters associated with the fuse 102 may be transmitted to a controller 106. The controller 106 may be configured to receive the sensor data and analyze, process, and/or evaluate the sensor data to determine whether the fuse 102 is properly selected for the intended application (e.g., appropriately rated). As an example and not by way of limitation, the controller 106 may be configured to compare the sensor data with one or more predetermined values associated with the fuse 102 to evaluate the performance of the fuse 102, thereby determining whether the fuse 102 satisfies particular operational requirements for the desired application. For example, the controller 106 may be configured with a predetermined value or threshold for a particular parameter, and may be further configured to compare the predetermined value or threshold to the parameter collected by the sensor 104. Based on this comparison, the controller 106 may be configured to determine whether the fuse is suitable for the current operating and environmental conditions. In some embodiments, the predetermined values may include fuse rating parameters such as a fuse link rated current, e.g., the root-mean-square (RMS) current values that a fuse can continuously carry without degrading or exceeding the applicable temperature rise limits under well-defined and steady-state conditions. In other embodiments, the predetermined values may include predefined voltage rating, resistance rating, temperature limit, or other suitable parameters. In certain embodiments, the controller 106 may be configured to process the sensor data before comparing the sensor data with the predetermined values. As a non-limiting example, the controller 106 may be configured to determine, based at least in part on the sensor data, numerical or mathematical metrics such as the average of the sensor data over a period of time or a rate of change of the sensor data over a period of time. As another example, the controller 106 may be configured to filter and/or normalize the sensor data to remove any possible erroneous or inconsistent data points. In certain embodiments, the controller 106 may use the sensor data directly (e.g., without any data processing).

Environmental conditions (e.g., ambient temperature, humidity, altitude, etc.) and other relevant conditions such as cyclic loading or overloading of the fuse, fuse aging, and so forth may often impact fuse performance. For example, when the fuse is exposed to high ambient air temperature such as about 60 degrees Celsius, the fuse's ability to dissipate heat by convection may be impeded, thereby affecting the rated parameters of the fuse. In other words, the predetermined fuse ratings, which are typically rated at an ambient temperature of about 20 degrees Celsius, may not accurately reflect the actual fuse capacity at different ambient temperatures. To account for the changes in fuse performance and other possible variations due to different operating and/or environmental conditions, in particular embodiments, the controller 106 may be configured to adjust one or more of the predetermined values associated with the fuse 102. As an example and not by way of limitation, the controller 106 may use a derating factor or a correction factor to adjust the predetermined values based on the actual conditions of the fuse. In one embodiment, the derating factor may be a temperature derating factor. For example, when the ambient temperature is higher than the ideal operating temperature of the fuse, a temperature derating factor may be applied to reduce the rated current of the fuse to a smaller value. The actual current flowing through the fuse 102 (e.g., as measured by the sensor 104) may then be compared with the reduced or adjusted current rating to determine whether the fuse has been correctly selected for the intended application. In other embodiments, the derating factor may take into account influence of altitude, humidity, thermal connection, cooling, electrical enclosure, cyclic loading, overloading, or other factors related to the conditions in which the fuse operates. In particular embodiments, the controller 106 may use a tolerance factor to adjust one or more of the predetermined values. The tolerance factor may specify an allowable deviation from the rated parameters at which the fuse operates. For example, if a fuse has a rated current of 100 amperes with a tolerance factor of 1.05, it may be acceptable for the measured current flowing through the fuse to go up to 105 amperes without triggering an alert that the fuse is inappropriately rated. This tolerance factor may account for manufacturing variations and ensure that the fuse is reliable for interrupting the circuit when the current exceeds the fuse's rated capacity, while also allowing for flexibility in actual conditions. In certain embodiments, one or more factors described above may be provided to the controller 106 in various formats, including a lookup table, a function, a model, or the like. In other embodiments, the various factors noted above may be built into the logic of the controller 106, or manually input or defined by an operator and communicated to the controller 106, e.g., via a user interface of a corresponding program or computer application.

In particular embodiments, the controller 106 may be configured to generate a fuse message based on the comparison between the sensor data and the predetermined values or the adjusted predetermined values of the fuse 102 discussed above. As an example and not by way of limitation, the fuse message may be an alert (e.g., visual, auditory, or tactile) that informs a user or operator that a wrong fuse has been selected when the parameters of the sensor data are substantially above or below the predetermined values or the adjusted predetermined values. Additionally or alternatively, the fuse message may include a recommendation for selecting an alternative fuse with more appropriate ratings, including, for example, voltage rating, current rating, or resistance rating.

In particular embodiments, the controller 106 may include a microcontroller. For example, the microcontroller may include one or more processors, one or more transmitters, and one or more memory devices that stores executable instructions, commands, control algorithms, and/or other data and information needed to operate the system 100. For example, the memory device may be a random access memory (RAM) or other forms of memory used in conjunction with RAM memory, including but not limited to flash memory, programmable read only memory, electronically erasable programmable read only memory, or the like. As used herein, the term "microcontroller" may refer not only to controller devices including a processor or microprocessor, but also to other suitable elements such as microcomputers, programmable logic controllers, reduced instruction set circuits, application specific integrated circuits, and other programmable circuits, logic circuits, equivalents thereof, and other suitable circuits or processors capable of executing the functions disclosed herein. The controller elements listed above are exemplary only, and are thus not intended to limit the scope of this disclosure.

In particular embodiments, the system 100 may also include a display 108, which may be communicatively coupled to the controller 106. Specifically, the controller 106 may be configured to transmit the fuse message to the display 108. The display 108 may be configured to display the fuse message, indicating to a user whether the fuse 102 is suitable for the intended application. In an embodiment, the display 108 may simply be a light-emitting diode (LED) element or a neon bulb configured to provide a visual indication of right or wrong fuse selection (e.g., green light indicating the fuse is properly selected and red light indicating the user has selected the wrong fuse.) Alternatively, the display 108 may be a graphical display screen configured to display to the user the generated fuse message in detail (such as an evaluation of fuse selection or an alternative fuse recommendation) and/or other suitable information related to the fuse 102 (such as the measured fuse data including real-time current passing through the fuse, fuse temperature, etc.). In certain embodiments, the display 108 may be coupled to the fuse housing that houses the fuse 102 in a manner that the displayed fuse message is easily observable to the user. In other embodiments, the display 108 may be provided proximately to the fuse or the fuse housing, or elsewhere such as at the fuse installation site or in a central control room. Additionally or alternatively, other suitable devices (e.g., a speaker for sound alert) may be used to provide the fuse message to the user.

In particular embodiments, the system 100 may be configured to be communicatively coupled to a computing device 110 associated with the user. For example, the computing device 110 may include a mobile cellular device, a tablet computer, a laptop computer, a desktop computer, or the like. In particular embodiments, the computing device 110 may include a user interface configured to display information associated with the fuse 102 as collected or generated by the system 100, allowing the user to monitor the fuse 102 in real-time. In certain embodiments, the user interface may also be configured with interactive functionalities, for example, functionalities that allow the user to request information about the fuse 102 from the system 100 on demand. Specifically, the controller 106 may transmit to the computing device 110 one or more messages related to the fuse 102. As an example and not by way of limitation, the messages may include information indicating whether the fuse 102 is suitable for use for the intended application and/or a recommendation suggesting an alternative fuse that is more appropriate. The messages may also include the sensor data indicating, for example, the measured operational parameters or environmental parameters related to the fuse 102 such as current, voltage, resistance, fuse temperature, ambient temperature, ambient humidity, etc. In further embodiments, the system 100 may be configured to transmit any suitable data and/or information to any suitable devices to allow the system 100 to perform the desired function of this disclosure.

In particular embodiments, the system 100 may be communicatively connected to various devices such as the computing device 110 described above via wired or wireless connection. Also, components of the system 100 such as the sensors 104, the controller 106, and the display 108 may be communicatively interconnected via wired or wireless connection. In particular embodiments, data or other types of information may be transmitted using any combination of networks configured to send and/or receive data communications using various communication protocols and transmission technologies. For example, the networks may include local area networks (LAN), wide-area network, and/or the Internet. As another example, the networks may include a mobile network (such as a mobile telephone network, cellular network, etc.), wired communication protocols (e.g., CAN, USB), and/or wireless communication protocols (e.g., WLAN, Bluetooth, Bluetooth Low Energy, near field communication (NFC), radio frequency identification (RFID), etc.). In particular embodiments, the networks may include any combination of networks described herein or known to one of skill in the art.

Figure 2:
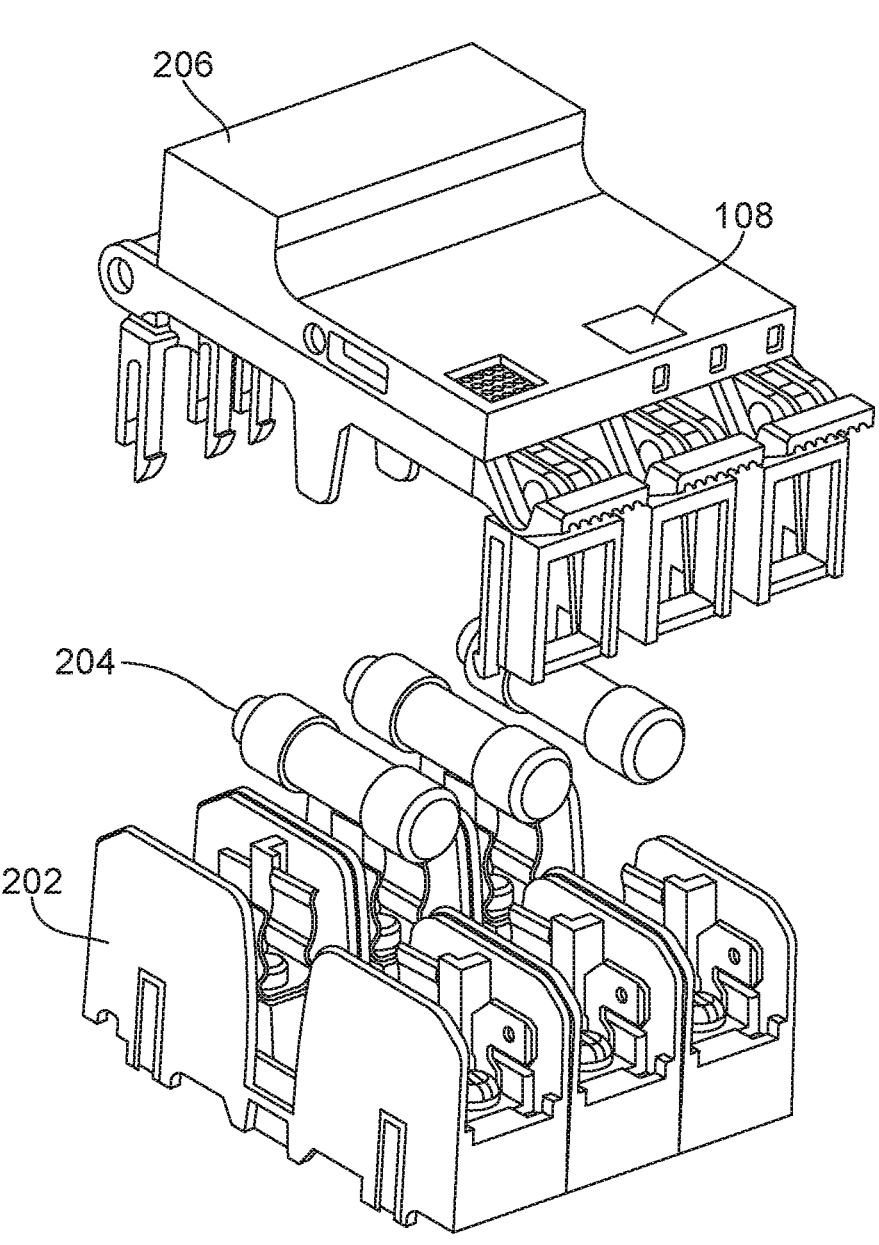
FIG. 2 illustrates a perspective view of an embodiment of a fuse assembly.

FIG. 2 illustrates a perspective view of an embodiment of a fuse assembly 200, which may be used with the system 100 described above with reference to FIG. 1. In the illustrated embodiment, the fuse assembly 200 is a three-pole fuse assembly, which may be used to hold three fuses. For example, in a three-phase electrical system, the three-pole fuse assembly may accommodate one working fuse for each of the three phases to provide individual circuit protection for each phase. In other embodiments, a single-pole fuse assembly or a multi-pole fuse assembly may be provided, which may accommodate any suitable number of fuse(s) and is compatible with various embodiments of the system 100 described above with reference to FIG. 1. In the illustrated embodiment, the fuse assembly 200 may include a fuse holder 202, multiple fuses 204 supported by the fuse holder 202, and a cover 206 that is removably coupled to the fuse holder 202 to cover the fuses 204. Each of the fuses 204 may be connected to an electrical circuitry to provide overcurrent protection. The cover 206 may serve as a safety cover to protect the fuses 204 contained by the fuse holder 202 from exposure to the external environment and/or provide electric insulation to the fuses 204. The cover 206 may also protect the external environment from the effects of arching or other undesirable effects resulting from a blown fuse. In an embodiment, the cover 206 may be configured with attachment mechanisms that allow the cover 206 to be installed to the fuse holder 202 without the use of any tools, for example, based on a mechanical locking feature corresponding to one or more tabs that are configured to fit into one or more openings and lock in place after fitting into the openings.

To monitor the performance of the fuses 204 in real-time and to provide a timely determination of whether the fuses 204 have been properly selected for the particular application, one or more components of the system 100 as described above with reference to FIG. 1 may be coupled to the fuse assembly 200. As an example and not by way of limitation, one or more sensors 104 may be configured proximately to the fuses 204. In certain embodiments, the sensors 104 may be mounted to the fuse holder 202 (e.g., within a cavity of the fuse holder 202 that receives the fuses 204) or to the cover 206 (e.g., on a lower side of the cover 206 that faces the fuses 204). In other embodiments, the sensors 104 may be directly or indirectly coupled to the fuses 204 or to the electric circuits connected to the fuses 204. As another example and not by way of limitation, the controller 106 may be located proximately to the fuses 204, e.g., the controller 106 may be mounted to the fuse holder 202 or to the cover 206. Alternatively, the controller 106 may be positioned remotely from the fuse assembly 200 and communicatively connected with the sensors 104 through wired or wireless connection. In the illustrated embodiment, the display 108 that is configured to display fuse message may be provided on an upper side of the cover 206 so that an operator may easily observe the displayed fuse message and monitor fuse condition without having to open the cover 206. In other embodiments, the display 108 may be positioned at other suitable locations that are observable by an individual. For example, as already discussed above, the display 108 may be an LED element or neon bulb configured to provide a binary indication of right or wrong fuse selection (e.g., green light for appropriate fuse, red light for inappropriate fuse), or a display screen configured to provide detailed fuse messages that indicate whether the fuse is appropriate or inappropriate rated, that indicate a suggestion for an alternative fuse, and that indicates real-time fuse data measured by the sensors 104. In certain embodiments, other electronic devices such as a transmitter, a receiver, or the like may be coupled to the fuse assembly 200 to perform or assist in performing the desired functions of this disclosure.

Figure 3:
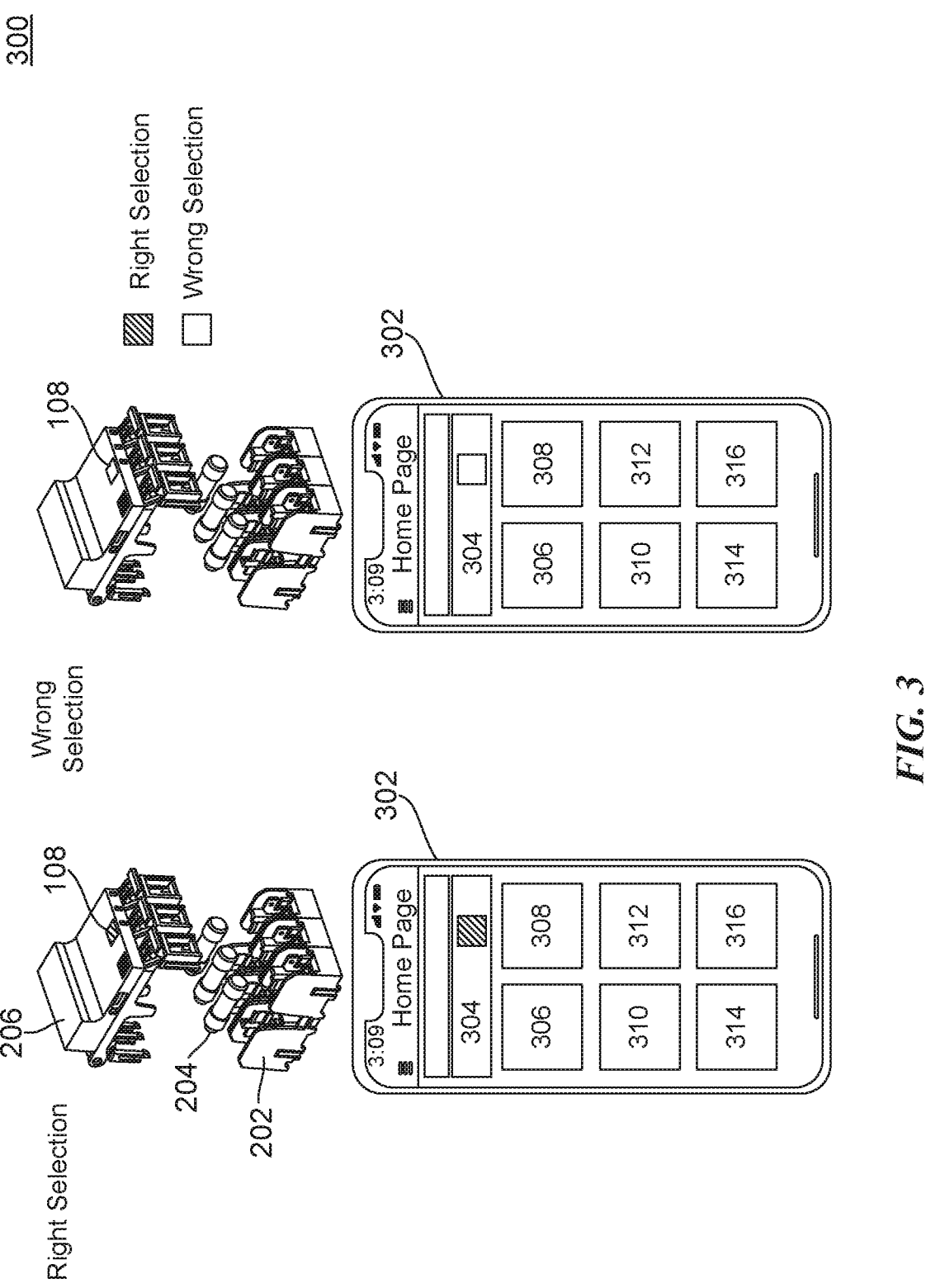
FIG. 3 illustrates a schematic view of another embodiment of an intelligent fuse and an example interface of an associated program.

FIG. 3 illustrates a schematic view of another embodiment of a system 300 that is configured to evaluate the appropriate rating of one or more fuses, specifically showing a user interface 302 that is presented by a corresponding computer program or application. The system 300 may incorporate the features described and is compatible with the embodiments of the system 100 and the fuse assembly 200 described above with reference to FIGS. 1-2. For example, the system 300 may be coupled to the fuse assembly 200 for monitoring the performance of the fuses 204 and determining whether the fuses 204 are properly selected for the desired application. In particular embodiments, the system 300 may use the display 108 on the cover 206 to inform the operator of the determination of fuse selection (e.g., whether the fuse is appropriately rated). In particular embodiments, the system 300 may use a user interface 302 to communicate with the operator. As illustrated, the user interface may display a fuse message 304 that may include information indicating whether the fuse is rated appropriately. The fuse message 304 may also include recommendations that suggests replacing the fuse with an alternative fuse with a more appropriate rating. In certain embodiments, the user interface 302 may display real-time operational parameters and real-time environmental parameters. As a non-limiting example, the operational parameters displayed may include current 306, voltage 308, resistance 310, fuse body temperature 312. The real-time environmental parameters displayed may include ambient temperature 314 and ambient humidity 316. For example, the parameters may be displayed using a metered gauge and/or a graphical or digital display. In certain embodiments, the user interface 302 may display various details of the fuse that could be used to identify the fuse such as a fuse class, a fuse rating, a fuse type, a fuse serial number, a fuse identification number, and other relevant details related to the fuse. In some embodiments, the user interface 302 may display data that is determined based on the parameters such as an estimated time period of the overall, or remaining, fuse life.

In particular embodiments, the user interface 302 may be interactive, allowing a user to communicate with the system 300. For example, the user interface 302 may be configured to receive one or more user inputs, such as via buttons, toggles, and/or drop-down menus. For example, the user interface may be configured to allow the user to request various information about a fuse on-demand. For example, upon user-interaction, a query message may be transmitted via the user interface 302 to a controller or a computing device of the system 300, and the requested information may be transmitted back to the user interface 302 and displayed to the user.

Figure 4:
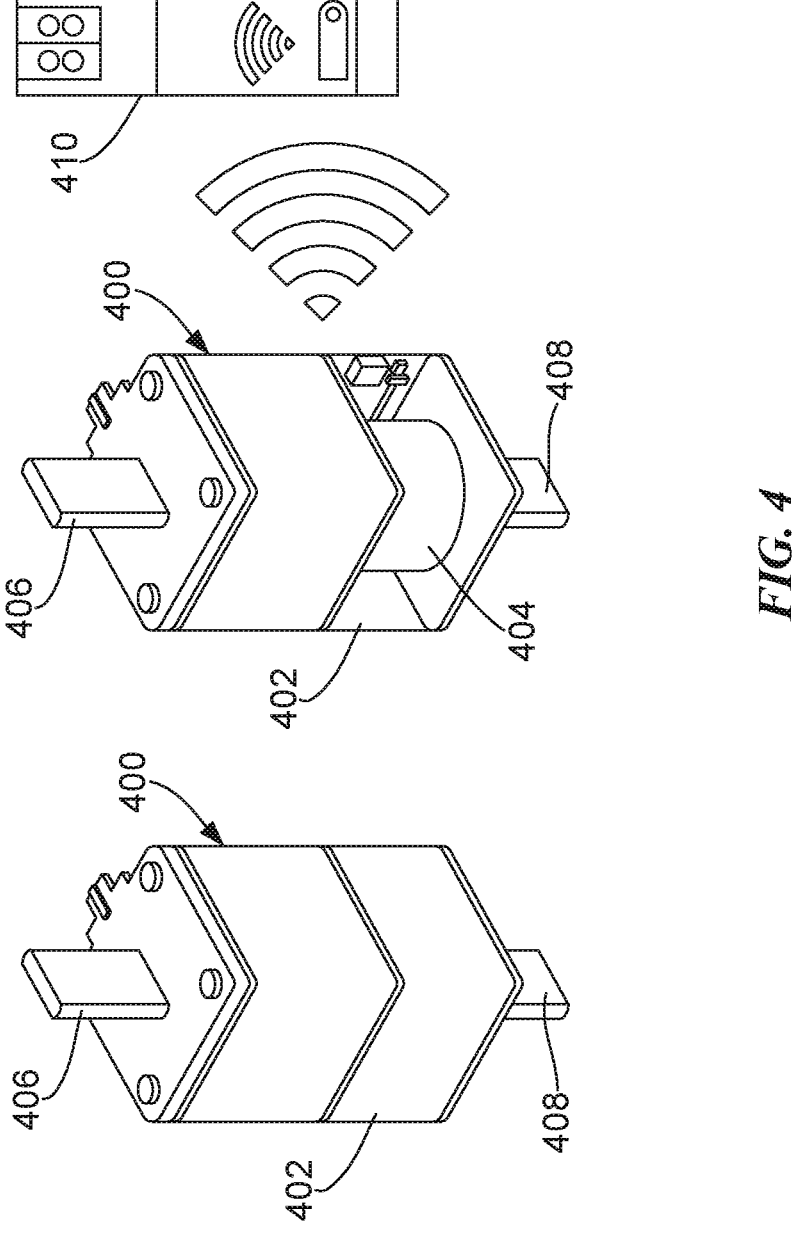
FIG. 4 illustrates a schematic view of an embodiment of a fuse.

FIG. 4 illustrates a schematic view of an embodiment of a fuse 400 that incorporates the features described and is compatible with the embodiments of the systems and the fuse assemblies described above with reference to FIGS. 1-3. In the illustrated embodiment, the fuse 400 may include a fuse casing 402 and a fuse element 404 that is housed or enclosed by the fuse casing 402. The fuse element 404 may be connected between two terminals 406, 408 that are configured to be connected to an electric circuit. For example, when the current flowing through the fuse 400 exceeds a certain limit/threshold, the fuse element 404 may heat and melt and interrupt the current flow from reaching sensitive circuit components. As further illustrated, one or more components of the systems as described above with reference to FIGS. 1-3 (such as the sensors 104, the controller 106, etc.) may be coupled to the fuse 400. This allows the system to detect various parameters of the fuse 400, determine whether the fuse 400 is suitable for the particular use, and/or perform other operations disclosed herein. In particular embodiments, a temperature sensor may be used to measure the operating temperature of the fuse 400 or the ambient (surrounding) temperature of the fuse 400. The temperature sensor may be mounted proximately to, or nearby, the fuse element 404 so as to accurately measure the temperature of the fuse element 404 (e.g., the inner wall of the fuse casing 402 as depicted). The controller 106 may be positioned near the sensor 104 or remotely from the sensor 104, and may be configured to receive sensor data from the sensor 104. In particular embodiments, a transmitter may be incorporated into the system. The transmitter may be configured to transmit the sensor data or other relevant fuse information to the controller 106 and/or other computing device 410 such as a mobile electronic device, a computer, or the like. The data may be transmitted using wired or wireless connections.

Figure 5:
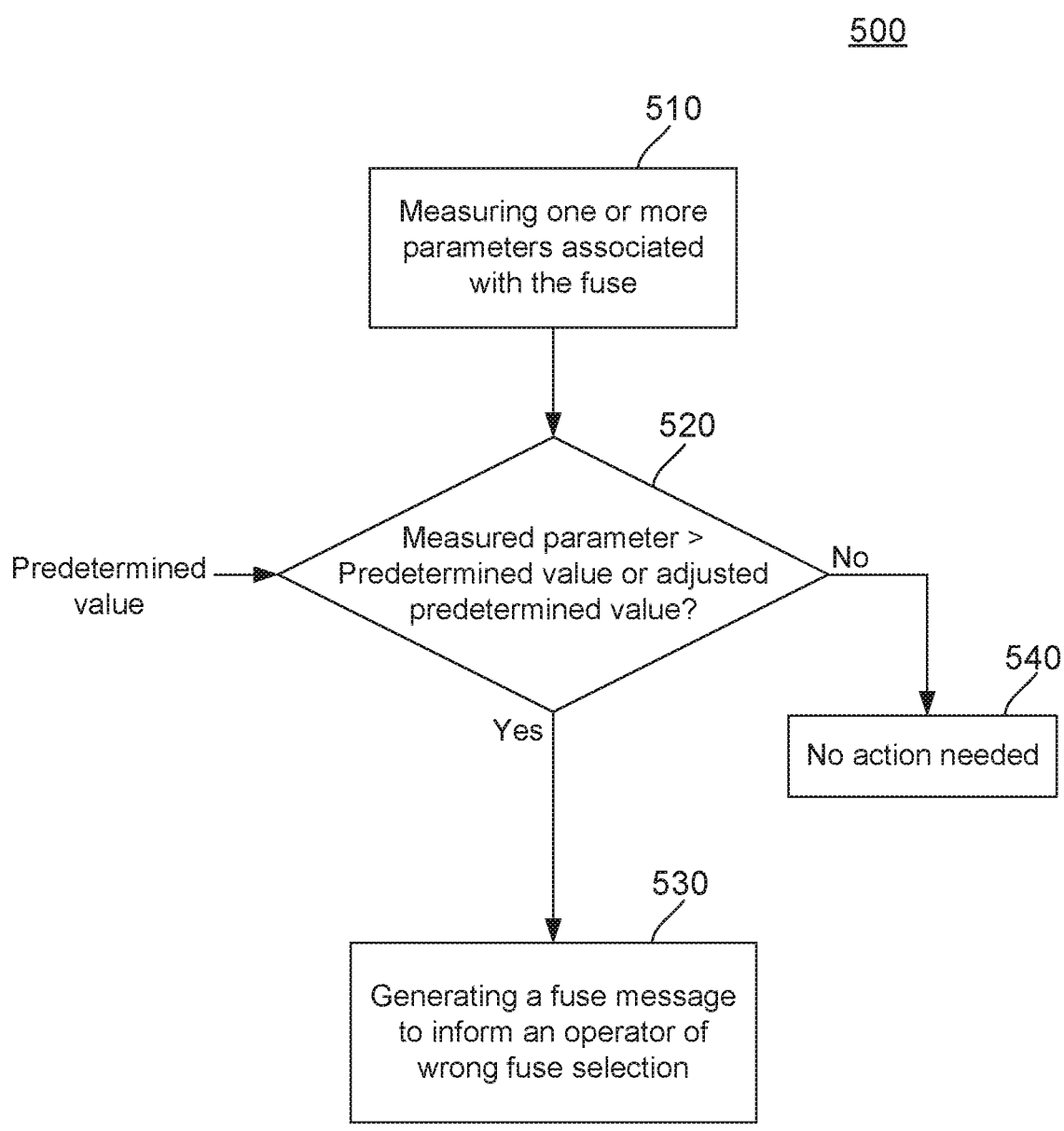
FIG. 5 illustrates a flow diagram of an example method for determining whether a correct fuse is used.

FIG. 5 illustrates a flow diagram of an example method 500 for determining whether one or more fuses are associated with a suitable performance capacity for the intended application. The method 500 may be performed by various embodiments as described above with reference to FIGS. 1-4 or by other suitable systems configured to perform the desired functions of this disclosure. The method 500 may begin at step 510, where various parameters associated with one or more fuses within a fuse housing may be measured by one or more sensors, such as the sensor 104 described above. For example, step 510 may involve measuring one or more operational parameters associated with the fuse such as current, voltage, resistance, fuse temperature, electrical loading, or other suitable parameters related to fuse performance. Step 510 may also involve measuring one or more environmental parameters corresponding to an environment in which the fuse is located such as ambient temperature, altitude, humidity, pressure, etc. For example, the sensors may incorporate a current sensor that detects real-time current through the fuse (e.g., input current, output current, etc.). As discussed herein, the sensors may include other types of sensors including but not limited to a voltage sensor, a resistance sensor, a fuse temperature sensor, an ambient temperature sensor, a humidity sensor, an altitude sensor, a pressure sensor, a force sensor, a vibration sensor, and other suitable sensors for measuring different parameters related to the fuse or an operating condition of the fuse.

At step 520, the method 500 may involve comparing the measured sensor data with a predetermined value. In particular embodiments, the predetermined value may be a preset fuse rating that specifies a rated capacity of the fuse under a well-defined and steady-state condition (such as a rated current). For example, the fuse rating may be a nameplate rating (e.g., a rating that is typically provided on the fuse body). In particular embodiments, the predetermined value may be stored in the system 100, input into the system 100, made accessible by the system 100, or otherwise integrated into the system firmware. In particular embodiments, the comparison of the collected sensor data and predetermined values may be performed using raw sensor data collected by the sensor. In other embodiments, the comparison may be performed based on processed sensor data, which may involve averaging data points over time, applying filters, or other forms of data processing.

In some embodiments, the method 500 may include comparing the sensor data with the predetermined value directly (e.g., without any intermediate step). In other embodiments, the method 500 may include adjusting or adapting the predetermined value and comparing the sensor data with the adjusted predetermined value, or adjusting or adapting the sensor data and comparing the adjusted sensor data with the predetermined value. For example, at step 520, the method 500 may include applying a tolerance factor to adjust the predetermined value. As discussed above, the tolerance factor may specify an allowable deviation from the rated parameters for the operation of the fuse. For example, if a fuse has a rated current of 100 amperes with a tolerance factor of 1.05, the system may be configured to tolerate up to 105 amperes without triggering an alert or notification.

At step 520, if the sensor data deviates from the adjusted predetermined value or continues to deviates from the adjusted predetermined value for a certain time period, the system may determine that the fuse is not appropriately rated for the particular application. The method 500 may then proceed to step 530. For example, the system may determine whether the measured real-time current flowing through the fuse is greater than the predetermined current rating multiplied by the tolerance factor. If so, the system may be configured to determine that the operating current is too high for the selected fuse, which may cause premature aging of the fuse or even lead to system failure. Similarly, the system may determine that the operating condition is too low for the selected fuse when the sensor data is below the adjusted predetermined value or is outside of a range of values.

At step 530, the method 500 may involve generating a fuse message based on the comparison of the measured parameters and predetermined values. The fuse message may include information indicating that a wrong fuse has been selected. The fuse message may include a fuse recommendation suggesting a replacement fuse with more appropriate ratings. The fuse message may also include information related to the sensor data measured by the sensor such as real-time current or voltage of the fuse, ambient temperature, ambient humidity, or other relevant information. In particular embodiments, the fuse message may be communicated to an operator (e.g., via the display 108, the computing device 110, or other suitable devices) to proactively alert the operator whether an appropriate fuse has been selected.

If the method 500 determines that a correct fuse has been selected based on the comparison, the method 500 may proceed to step 540. At step 540, in certain embodiments, since the fuse in use is determined to be suitable for the application, the method 500 may conclude without further action. In certain embodiments, the method 500 may return to step 510 to continuously monitor fuse performance and alert the operator if the fuse malfunctions. In particular embodiments, at step 540, the method 500 may include generating a fuse message that includes information confirming that the right fuse has been selected. For example, as discussed herein, the fuse message may be communicated to an operator, e.g., via the display 108, the computing device 110, or other suitable devices.

FIG. 6 illustrates a flow diagram of another example method 600 for determining whether one or more fuses are associated with a suitable performance capacity for the intended application. The method 600 may be performed by various embodiments as described above with reference to FIGS. 1-4 or by other suitable systems configured to perform the desired functions of this disclosure. The method 600 may incorporate any steps of the embodiments of the method 500 as described above with reference to FIG. 5. The method 600 may begin with measuring one or more parameters associated with one or more fuses, where the parameters are collected by one or more sensors such as the sensor 104 described above. For example, at step 610, the method 600 may involve measuring one or more operational parameters associated with the fuse such as current, voltage, resistance, fuse temperature, electrical loading, or other suitable parameters related to fuse performance. At step 620, the method 600 may involve measuring one or more environmental parameters corresponding to an environment in which the fuse is located such as ambient temperature, altitude, humidity, pressure, etc. In particular embodiments, the sensors may include a current sensor that detects real-time current of the fuse (e.g., input current, output current, etc.). The sensors may also include a temperature sensor that measures ambient temperature of an environment in which the fuse is located. As discussed herein, the sensors may include other types of sensors including but not limited to a voltage sensor, a resistance sensor, a fuse temperature sensor, a humidity sensor, an altitude sensor, a pressure sensor, a force sensor, a vibration sensor, and other suitable sensors for measuring different parameters related to the fuse or an operating condition of the fuse.

In particular embodiments, the method 600 may include comparing the measured sensor data with a predetermined value. In particular embodiments, the predetermined value may be a preset fuse rating specifying a rated capacity (such as a rated current) of the fuse under a well-defined or steady-state condition. For example, the fuse rating may be a nameplate rating (e.g., a rating that is typically provided on the fuse body). In particular embodiments, the predetermined value may be stored in the system 100, input into the system 100, made accessible by the system 100, or otherwise be integrated into the system firmware. In particular embodiments, the comparison may be performed using raw sensor data collected by the sensor. In other embodiments, the comparison may be performed based on processed sensor data, which may involve averaging data points over time, applying filters, or other forms of data processing.

In some embodiments, the method 600 may include comparing the sensor data with the predetermined value directly (e.g., without any intermediate step). In other embodiments, the method 600 may include adjusting or adapting the predetermined value and comparing the sensor data with the adjusted predetermined value, or adjusting or adapting the sensor data and comparing the adjusted sensor data with the predetermined value. For example, at step 630, the method 600 may involve determining the derating factor based on environmental parameters. And at step 640, the method 600 may involve applying the derating or correction factor to the predetermined value. This may advantageously allow the method 600 to take into account variations in fuse ratings due to different operating or environmental conditions in which the fuse operates. For example, as already discussed, an ambient temperature that is higher than the rated temperature of the fuse may affect fuse performance, which would reduce the actual current-carrying capacity of the fuse to a lower value than the predetermined rated current. By using the derating factor to adjust the predetermined value, the method 600 may yield more-reliable and more-accurate evaluation of the appropriate fuse ratings despite typical variations in operating conditions of the fuse. In particular embodiments, the derating factor may be determined from a lookup table (such as the diagram 700 described below with reference to FIG. 7), function, equation, or other data structures. The derating factor may be used to correlate or map a particular parameter to the operating condition. An example of the particular parameter may be a parameter collected by the sensor in real-time, such as the ambient temperature. In particular embodiments, the derating or correction factor may be a temperature derating factor, a thermal connection derating factor, a cooling air correction factor, a high-altitude derating factor, an electrical enclosure correction factor, a cyclic loading derating factor, an overloading derating factor, or other suitable factor that potentially affects fuse performance.

At step 650, if the sensor data deviates from the adjusted predetermined value or continues to deviate from the adjusted predetermined value for a certain time period, the method 600 may determine that the fuse is not appropriately rated and/or not suitable for the particular application. The method 600 may then proceed to step 660. For example, if the measured real-time current flowing through the fuse is determined to be greater than the predetermined current rating multiplied by the derating factor value at the current ambient temperature, the system may determine that the operating current is too high for the selected fuse and may cause premature aging of the fuse, damage to various fuse components, or even lead to system failure. Similarly, the system may determine that a wrong fuse has been selected when the sensor data is below the adjusted predetermined value or is outside of a range of values.

At step 660, the method 600 may include generating a fuse message based on the comparison of the input parameters and predetermined values. The fuse message may include information indicating that a wrong fuse has been selected. The fuse message may include a fuse recommendation that suggests replacing the fuse with a fuse that is more appropriately rated. The fuse message may also include information related to the sensor data measured by the sensor such as real-time current or voltage of the fuse, ambient temperature, ambient humidity, or other relevant information. In particular embodiments, the fuse message may be communicated to an operator (e.g., via the display 108, the computing device 110, or other suitable devices) to proactively alert the operator that a wrong fuse has been selected, so that the operator may remove and replace the wrong fuse in time.

If the method 600 determines that a correct fuse has been selected based on the comparison, the method 600 may proceed to step 670. At step 670, in certain embodiments, since the fuse in use is determined to be suitable for the application, the method 600 may conclude without further action. In certain embodiments, the method 600 may return to step 610 to continuously monitor fuse performance and alert the operator if the fuse malfunctions. In particular embodiments, at step 670, the method 500 may include generating a fuse message that includes information confirming that the right fuse has been selected. For example, as discussed herein, the fuse message may be communicated to an operator, e.g., via the display 108, the computing device 110, or other suitable devices.

FIG. 7 illustrates an example diagram 700 that can be used to determine the derating factor. The exemplary diagram may be used to determine a temperature derating factor at a specific ambient temperature. As discussed, the derating factor may be used to adjust or adapt the sensor data or the predetermined fuse value such as fuse rating based on the actual condition in which the fuse operates. For example, for a fuse that is designed with a rated current of 100 amperes at 20 degrees Celsius, if the ambient temperature reaches 60 degrees Celsius, it may be important to evaluate the temperature derating factor to accommodate the difference in temperatures. For example, according to diagram 700, when the ambient temperature is 60 degrees Celsius, the temperature derating factor would be 0.8. If the load current of the application as measured by a current sensor is 200 amperes, by applying the derating factor, the adjusted current value would be 0.8*200=160 amperes. Since this value is substantially greater than the 100 amperes rated current of the fuse, the system may determine that the wrong fuse has been selected for this particular application. In certain embodiments, a fuse recommendation may also be generated based on the calculation, which may suggest that a fuse with 160 amperes rated current should be selected. As discussed herein, in particular embodiments, the diagram 700 and/or corresponding lookup table may be stored in the fuse system, built into the system firmware, input into the system, or otherwise made accessible to the components of the system. In particular embodiments, other forms of data structures (such as function, equation, mathematical model, etc.) may be used to correlate other operating conditions (such as altitude, humidity, overloading, etc.) with the fuse's performance capacity.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A system for determining appropriate ratings of one or more fuses within a fuse housing, the system comprising:
   at least one sensor configured to measure operational data associated with the one or more fuses; and
   a controller coupled to the at least one sensor, wherein the controller is configured to perform operations comprising:
   adjusting predetermined values associated with the one or more fuses based on a tolerance factor;
   receiving the operational data from the at least one sensor;
   comparing the operational data with the adjusted predetermined values associated with the one or more fuses; and
   generating a fuse message based on the comparison, wherein the fuse message includes information indicating whether the one or more fuses are associated with appropriate ratings.

2. The system of claim 1, wherein the operational data comprises data associated with current, voltage, or resistance of the one or more fuses.

3. The system of claim 1, wherein the operations further comprise:
   adjusting the predetermined values based on a derating factor; and
   comparing the operational data with the adjusted predetermined values associated with the one or more fuses.

4. The system of claim 3, wherein the derating factor is determined based on environmental data corresponding to an environment in which the one or more fuses are located.

5. The system of claim 4, wherein the environmental data comprises data associated with ambient temperature, altitude, or humidity of the environment.

6. The system of claim 1, wherein the fuse message comprises an alert indicating that the one or more fuses are not associated with appropriate ratings.

7. The system of claim 1, wherein the fuse message comprises a recommendation for an alternative fuse.

8. The system of claim 1, further comprising a display configured on the fuse housing to display the fuse message.

9. The system of claim 1, wherein the operations further comprise transmitting the fuse message to a computing device having a user interface configured to display the fuse message.

10. A method for determining appropriate ratings of one or more fuses within a fuse housing, the method comprising:

adjusting, by a controller, predetermined values associated with the one or more fuses based on a tolerance factor;

measuring, by at least one sensor, operational data associated with the one or more fuses, comparing, by the controller, the operation data with the adjusted predetermined values associated with the one or more fuses; and generating, by the controller, a fuse message based on the comparison, wherein the fuse message includes information indicating whether the one or more fuses are associated with appropriate ratings.

11. The method of claim 10, wherein the operational data comprises data associated with current, voltage, or resistance of the one or more fuses.

12. The method of claim 10, further comprising:

adjusting the predetermined values based on a derating factor; and comparing the operational data with the adjusted predetermined values associated with the one or more fuses.

13. The method of claim 12, wherein the derating factor is determined based on environmental data corresponding to an environment in which the one or more fuses are located.

14. The method of claim 13, wherein the environmental data comprises data associated with ambient temperature, altitude, or humidity of the environment.

15. The method of claim 10, wherein the fuse message comprises an alert indicating that the one or more fuses are not associated with appropriate ratings.

16. The method of claim 10, wherein the fuse message comprises a recommendation for an alternative fuse.

17. The method of claim 10, further comprising sending instructions to display the fuse message on a display configured on the fuse housing.

18. The method of claim 10, further comprising transmitting the fuse message to a computing device having a user interface configured to display the fuse message.

* * * * *